United States Patent [19]

Ikuhara et al.

[11] Patent Number: 4,936,967

[45] Date of Patent: Jun. 26, 1990

[54] METHOD OF DETECTING AN END POINT OF PLASMA TREATMENT

[75] Inventors: Shoji Ikuhara; Keiji Tada; Yoshinao Kawasaki; Katsuyoshi Kudo; Minoru Soraoka, all of Kudamatsu, Japan

[73] Assignee: Hitachi, Ltd., Tokyo, Japan

[21] Appl. No.: 368

[22] Filed: Jan. 5, 1987

[51] Int. Cl.$^5$ .................. H01L 21/306; H01L 21/465
[52] U.S. Cl. ............................. 204/192.33; 156/345; 156/626; 156/643; 204/298.32
[58] Field of Search .......................... 204/192.33, 298; 156/643, 626, 345; 427/38, 39, 40, 41; 422/186.05

[56] References Cited

U.S. PATENT DOCUMENTS

| | | | |
|---|---|---|---|
| 4,415,402 | 11/1983 | Gelernt et al. | 156/626 |
| 4,457,820 | 7/1984 | Bergeron et al. | 204/192 E |
| 4,491,499 | 1/1985 | Jerde et al. | 156/626 |
| 4,615,761 | 10/1986 | Tada et al. | 156/626 |

Primary Examiner—John F. Niebling
Assistant Examiner—William T. Leader
Attorney, Agent, or Firm—Antonelli, Terry & Wands

[57] ABSTRACT

The present invention relates to a method of and apparatus for detecting an end point of plasma treatment of a specimen. There is included selecting plasma spectrum having a characteristic wavelength from the plasma spectrum generating at the time of reaction in the plasma treatment of a specimen, setting a disregarding time for the plasma treatment end point detection, assuming, at the stage when the disregarding time for treatment end point detection has elapsed, a quantity of the selected plasma spectrum up to the time of said stage based on a quantity of same plasma spectrum at the time of said stage and a variation with the time in the last said quantity of plasma spectrum, and detecting the reaction time end point from the assumed quantity of plasma spectrum and an actual quantity of the same plasma spectrum after the time of said stage thereby making it possible to prevent erroneous detection of the end point of reaction in the plasma treatment and detect accurately the same even when the reaction time of the plasma treatment is short.

4 Claims, 2 Drawing Sheets

METHOD OF DETECTING AN END POINT OF PLASMA TREATMENT

BACKGROUND OF THE INVENTION

1. Field of the Invention

The present invention relates to a method of and apparatus for detecting an end point of plasma treatment, and, more particularly, to a method of and apparatus for detecting an end point of plasma treatment which is suitable for detection of the end point of reaction in the plasma treatment of a specimen such as the substrate of a semiconductor device by selecting a plasma spectrum having a characteristic wavelength from the plasma spectrum generated at the time of reaction in the plasma treatment of such a specimen and by determining said end point from a variation in the quantity of the selected plasma spectrum vis-à-vis the reaction time of the plasma treatment.

2. Description of the Prior Art

A known technique for detecting the end point of reaction in the plasma treatment of a specimen such as a semiconductor device substrate includes selecting plasma spectrum having a characteristic wavelength from the plasma spectrum generated at the time of reaction and detecting the same from a variation in the quantity or intensity of the selected plasma spectrum vis-à-vis the reaction time of the plasma treatment, according to the example which is disclosed in Japanese Patent Laid-Open No. 115536/1981 or Japanese Patent Laid-Open No. 94423/1984.

The radiation corresponding to a reaction product, out of the plasma spectrum generated at the time of reaction in the plasma treatment of a specimen, such as the substrate of a semiconductor device, increases sharply upon starting of the reaction of plasma treatment, reaches its normal state within a short period of time, decreases sharply upon ending of the reaction of plasma treatment, and then assumes its normal state.

According to the technique disclosed in Japanese Patent Laid-Open No. 94423/1984, the end point of reaction in the plasma treatment is determined at the stage when the quantity of the radiation corresponding to a reaction product, i.e., the quantity of plasma spectrum, has decreased sharply upon ending of the reaction of plasma treatment and has assumed its normal state, namely, at the stage when a secondary differential value of a function of the quantity of plasma spectrum/reaction time has reached a preset level. Or, according to the technique disclosed in Japanese Patent Laid-Open No. 115536/1981, the end point of reaction in the plasma treatment is determined at the stage when a primary differential value of the above function of the quantity of plasma spectrum based on the reaction time has reached a preset level.

In these conventional techniques, the primary and the secondary differential values by computation have a time lag from the actual primary and secondary differential values for the following reasons:

(1) sampling of data is conducted at specified intervals, and therefore it is impracticable to increase a data sampling speed infinitely;

(2) a filter is provided in the electric circuit in order to prevent errors in the detection as a result of noise, and the average operation performed with respect to numerical operation is subjected to a time lag due to the effect of such a filter; and (3) computation of differentiation itself is made by computing the difference between the sampled past data and the sampled present data, from which always only the past differential values can be known.

Meanwhile, in order to prevent erroneous detection of the end point of reaction in the plasma treatment, a period of time from the point of start of the reaction of plasma treatment, for which the detection of the end point of reaction in the plasma treatment is not effected, hereinafter referred to as the disregarding time for plasma treatment end point detection, is established. Namely, the detection of the end point of reaction in the plasma treatment is executed after this disregarding time for treatment end point detection has passed off. This disregarding time corresponds to a range in which the quantity of plasma spectrum increases sharply after the reaction of the plasma treatment starts, and a determination is not made by comparison of the differential values corresponding to the disregarding time with a predetermined reference value for determination.

In the case, for example, where a specimen, such as the substrate of a semiconductor device, is $SiO_2$ or Al, where the reaction time of the plasma treatment is comparatively long, the end point of reaction in the plasma treatment can be detected by conventional techniques described above. But, in case, for example, such a specimen is Poly-Si, where the reaction time of the plasma treatment is short (the time of plasma etching of Poly-Si is, say, approximately one-tenth of that of plasma etching of $SiO_2$ of Al), duration of a time of the normal state following the disregarding time for treatment end point detection is short. In such a case, the end point of reaction in the plasma treatment may erroneously be detected by the subjected time lag due to the above reasons (1), (2) and (3), hence there may be a difficulty in accurately detecting the end point of reaction in the plasma treatment.

SUMMARY OF THE INVENTION

An object of the present invention is to provide a method of and an apparatus for detecting the end point of plasma treatment, whereby it is made possible to prevent erroneous detection of the end point of reaction in the plasma treatment and to detect accurately the end point of reaction in the plasma treatment even when the reaction time of the plasma treatment is short.

The present invention is characterised in that, by using an apparatus comprising a means of selecting plasma spectrum having a characteristic wavelength from the plasma spectrum generated at the time of reaction in the plasma treatment of a specimen, a means of counting the plasma treatment reaction time of said specimen, a means of differentiating a function of a quantity of the selected plasma spectrum with respect to said plasma treatment reaction time, a means of setting the disregarding time for treatment end point detection said disregarding time corresponding to a range after the start of the plasma treatment reaction time in which a quantity of the selected plasma spectrum is increasing sharply, and not taking into consideration the differential values corresponding to the disregarding time period when making a determination by comparing the differential values corresponding to the plasma treatment time period with the predetermined reference value, a means of assuming a linear relationship at the stage when the disregarding time for treatment end point detection has elapsed a quantity of the selected plasma spectrum up to the time of said stage based on a quantity of same plasma spectrum at the time of said stage and initiating the differential value up to the time of said disregarding time based on the assumed quantity, and a means of detecting the end point of reaction in the plasma treatment of the specimen from the quantity of plasma spectrum as assumed by said means and an actual quantity of said plasma spectrum since the time of said stage, the end point of reaction in the plasma treatment of the specimen is detected by selecting plasma spectrum having a characteristic wavelength from the plasma spectrum generated at the time of reaction in the plasma treatment of the specimen, by counting the plasma treatment reaction time of the specimen, by differentiating a function of a quantity of the selected plasma spectrum with respect to the plasma treatment reaction time, by setting the disregarding time for treatment end point detection, by assuming a linear relationship at the stage when the disregarding time for treatment end point detection has elapsed a quantity of the selected plasma spectrum up to the time of said stage based on a quantity of same plasma spectrum at the time of said stage and initiating the differential value up to the time of the disregarding time based on the assumed quantity, and by determining the end point of reaction in the plasma treatment of the specimen from the assumed quantity of plasma spectrum and an actual quantity of same plasma spectrum since the time of said stage, thereby making it possible to prevent, erroneous detection of the end point of reaction in the plasma treatment and detect accurately the same even when the reaction time of the plasma treatment is short.

DESCRIPTION OF THE PREFERRED EMBODIMENT

An embodiment of the present invention will be described with reference to FIGS. 1 to 4.

Figure 1:
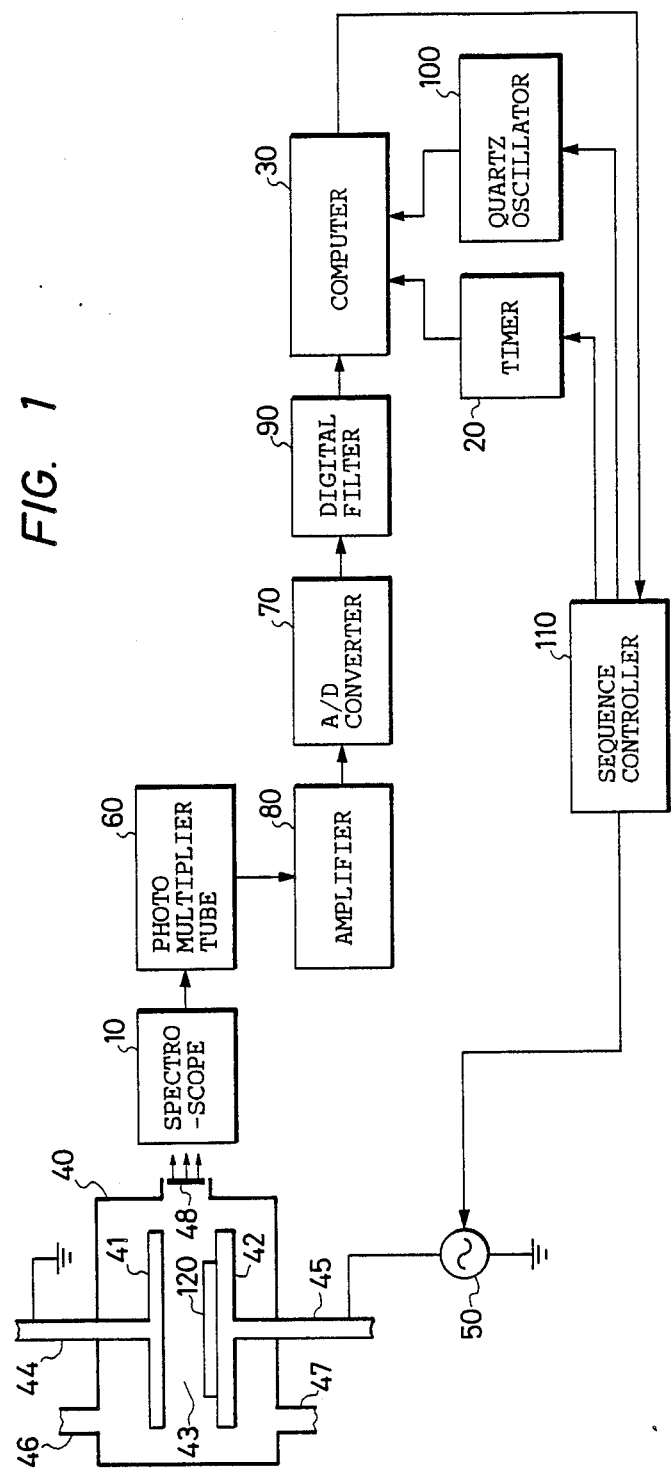
FIG. 1 is a block diagram illustrating an embodiment of the apparatus for detecting the end point of plasma treatment according to the present invention.

In FIG. 1, the apparatus for detecting the end point of plasma treatment includes a means of selecting plasma spectrum having a characteristic wavelength from the plasma spectrum generated at the time of reaction in the plasma treatment of a specimen, e.g. a spectroscope 10, and a means of setting the disregarding time for treatment end point detection, e.g. a timer 20 and e.g. a computer 30. Of this composition, the computer 30 has a function of assuming at the stage when the disregarding time for treatment end point detection has passed off a quantity of the selected plasma spectrum up to the time corresponding to the said stage based on a quantity of same plasma spectrum at the time of said stage and initiating the differential value up to the time of said disregarding time based on the assumed quantity, as well as a function of detecting the end point of reaction in the plasma treatment of the specimen from the assumed quantity of plasma spectrum and an actual quantity of same plasma spectrum since the time corresponding to the said stage.

For instance, with respect to FIG. 1, in a treatment chamber 40 of the plasma etching apparatus, an opposing electrode 41 and a specimen electrode 42 are disposed to be opposed to each other and having a discharge space 43 therebetween. In other words, the opposing electrode 41 is disposed substantially horizontally at the lower end of an electrode shaft 44 which is provided through the top wall of the treatment chamber 40 with its lower end portion projecting inside the treatment chamber 40. Meanwhile, the specimen electrode 42 is disposed substantially horizontally at the upper end of an electrode shaft 45 which is provided through the bottom wall of the treatment chamber 40 with its upper portion projecting inside the treatment chamber 40, the specimen-mounting surface thereof being faced upward. A nozzle 46 for introducing a reaction gas is provided at the top wall of the treatment chamber 40. The nozzle 46 is connected to a reaction gas-introducing system (not shown). An exhaust nozzle 47 is provided at the bottom wall of the treatment chamber 40. The nozzle 47 is connected to a vacuum exhausting unit (not shown). The electrode shaft 44 is grounded. The electrode shaft 45 is connected to a radio-frequency power supply 50, which serves as the power supply for the apparatus, and the radio-frequency power supply 50 is grounded.

Further, in FIG. 1, a peep hole 48 is provided at a side wall corresponding to the discharge space 43 in the treatment chamber 40. The spectroscope 10 is disposed outside the treatment chamber 40 in the place corresponding to the peep hole 48. The spectroscope 10 is connected to a means of converting the quantity of the selected plasma spectrum into an analog electric signal, e.g., a photomultiplier tube 60. In this arrangement, the photomultiplier tube 60 is connected to a means of converting the analog electric signal to a value of digital data, e.g., an A/D converter 70 via an amplifier 80. The A/D converter 70 is connected to the computer 30 via a digital filter 90. The computer 30 is connected to the timer 20. The computer 30 is also connected to a means of counting the reaction time of plasma treatment of a specimen, e.g., a quartz oscillator 100, and to a sequence controller 110, respectively. The sequence controller 110 is connected to the timer 20, the quartz oscillator 100 and the radio-frequency power supply 50 respectively.

According to this arrangement of FIG. 1, one piece of specimen 120 is carried into the treatment chamber 40 by a known carrying means (not shown), and is mounted on the specimen-mounting surface of the specimen electrode 42 with the surface to be treated being faced upward. Subsequently, the inside of the treatment chamber 40 is evacuated to a predetermined pressure by operation of the vacuum exhausting unit. Then, a specified reaction gas is introduced by the reaction gas-introducing system at a predetermined flow rate into the treatment chamber 40 via the nozzle 46, and at the same time, part of the reaction gas so introduced is exhausted outside the treatment chamber 40 via the nozzle 47. In this way, the pressure inside the treatment chamber 40 can be adjusted to a predetermined etching pressure. At this time, a discharge-starting signal is issued by the sequence controller 110 to the radio-frequency power supply 50, and to the specimen electrode 42 is applied a predetermined radio-frequency power by the radio-frequency power supply 50 via the electrode shaft 45. Consequently, a glow discharge develops between the opposing electrode 41 and the specimen electrode 42, i.e., in the discharge space 43. The reaction gas is converted into plasma by this glow discharge, and the surface of the specimen 120 to be treated is etched with plasma. At this time, a plasma spectrum is generated. If this plasma spectrum is taken as, say, the radiation corresponding to a reaction product produced from the etching treatment of the specimen 120, radiation having a characteristic wavelength is selected by the spectroscope 10 via the peep hole 48. The quantity of radiation as selected by the spectroscope 10 is converted into an analog electric signal by the photomultiplier tube 60, and this analog electric signal is then amplified by the amplifier 80. The amplified analog electric signal is converted into a value of digital data by means of the A/D converter 70, and this value of digital data is smoothed by the digital filter 90 and inputted into the computer 30. Meanwhile, at the time when a discharge-starting signal is issued from the sequence controller 110 to the radio-frequency power supply 50, the counting of the etching reaction time, which is the reaction time of plasma reaction, begins at the quartz oscillator 100. The etching reaction time thus counted is inputted into the computer 30 from the quartz oscillator 100, while the disregarding time for treatment end point detection is inputted into the computer 30 from the timer 20. In this sequence, the primary or the secondary differential computation of a function of the quantity of the selected radiation with respect to the reaction time of plasma treatment, i.e., a function between the value of digital data inputted into the computer 30 and the radiation time of plasma etching inputted into the computer 30, is to be performed by the computer 30 from the point of start of the etching treatment of the specimen 120.

Figure 2:
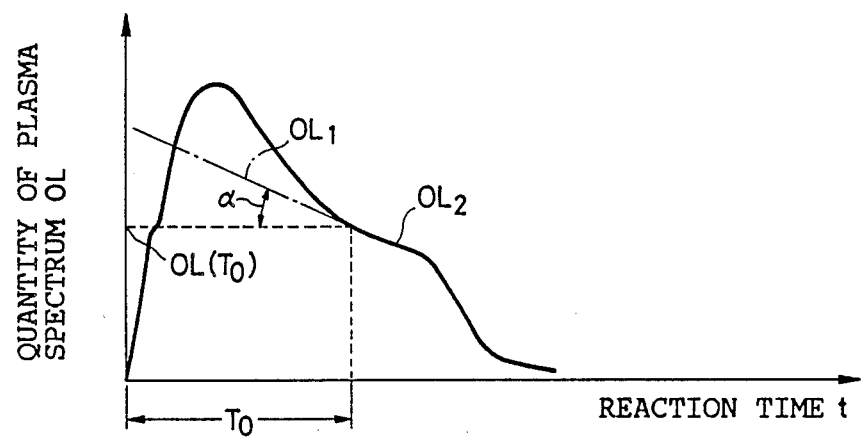
FIG. 2 is a diagram illustrating the relationship between the quantity of plasma spectrum and the reaction time, which serves to explain the method of detecting the end point of plasma treatment according to the present invention.
Figure 3:
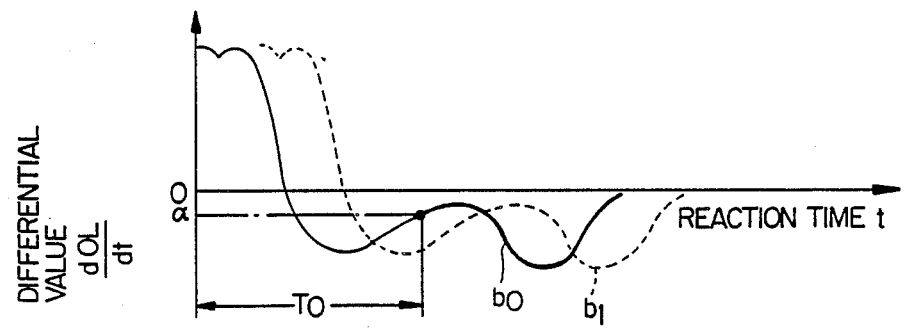
FIG. 3 is a diagram illustrating the relationship between the primary differential value of a function of the quantity of plasma spectrum/reaction time and the reaction time as well.
Figure 4:
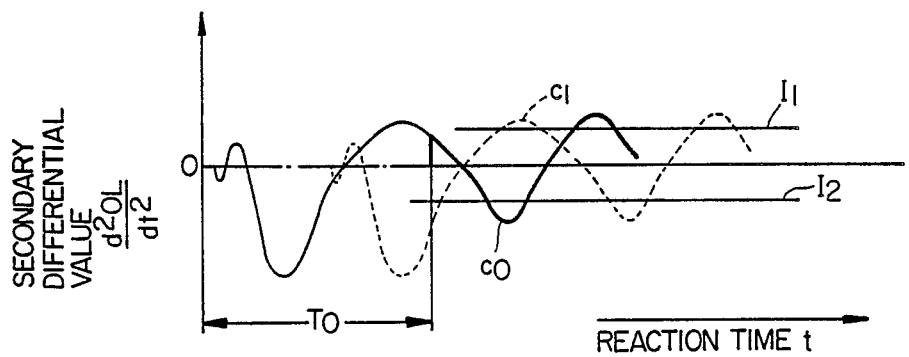
FIG. 4 is a diagram illustrating the relationship between the secondary differential value of a function of the quantity of plasma spectrum/reaction time and the reaction time as well.

In FIG. 2, at the stage when the disregarding time for treatment end point detection (To) to be inputted into the computer 30 from the timer 20 and set therein has ended, the assumed quantity of radiation ($OL_1$) is extrapolated as indicated by a dashed line. In this case, it is assumed that the quantity of radiation until the stage of ending of the disregarding time for plasma treatment end point detection (To) would have been on a line with the same slope as and extended from that of the quantity of radiation (OL(To)) at the stage of ending of the disregarding time for treatment end point detection (To). Concurrently with this, the primary and the secondary differentiations which have been computed by the computer 30 from the point of start of the etching are initiated as illustrated in FIG. 3 and FIG. 4. In other words, in the case of primary differentiation, as indicated by a dashed line in FIG. 3, initiation takes place in a variation with the time in the quantity of radiation at the stage of ending of the disregarding time for treatment end point detection (To), and in the case of secondary differentiation, initiation takes place at zero as indicated in FIG. 4. Namely, the time lag of the primary and the secondary differentiations which had been computed by the computer 30 until the disregarding time (To), is removed. Thereby, primary and the secondary differentiations subsequent to the initiation proceed at a real time corresponding to the quantity of radiation ($OL_1$) which has been assumed by extrapolation and an actual quantity of radiation ($OL_2$) after the stage of ending of the disregarding time for treatment end point detection (To). In this case, $b_0$ indicated in FIG. 3 is primary differential value, and $c_0$ indicated in FIG. 4 is the secondary differential value. Also, $b_1$ indicated in FIG. 3 is the primary differential value in the above conventional technique, and $c_1$ indicated in FIG. 4 is secondary differential in the above conventional technique. Furthermore, $I_1$ and $I_2$ indicated in FIG. 4 are predetermined reference values for determination, which are to be preset into the computer 30. Further, in FIG. 2, if the quantity of radiation at the stage of ending of the disregarding time for treatment end point detection (To) is taken as OL(To) and a variation in the quantity of radiation with the time is $\alpha$, then the quantity of radiation $OL_1$ up to the stage of ending of the disregarding time for treatment end point detection (To) is extrapolated as $OL_1 = OL(To) - \alpha(t - To)$ where t is the reaction time. The primary differentiation in this instance is initiated as the value of $\alpha$.

In this way, at the point of time when the primary or the secondary differential value ($b_0$ indicated in FIG. 3 or $c_0$ indicated in FIG. 4) under computing by the computer 30 has reached a predetermined reference value ($I_1$ and/or $I_2$ indicated in FIG. 4) for determination, which is to be preset into the computer 30, the end point of reaction in the plasma etching of the specimen 120 is detected. At this moment, an end point detection signal is issued from the computer 30 to the sequence controller 110, and, in turn, from the sequence controller 110 a discharge stop signal is issued to the radio-frequency power supply 50. Consequently, the glow discharge in the discharge space 43 is stopped. The specimen 120 is then removed from the specimen electrode 42 by means of a known carrying means, and is taken out of the treatment chamber 40.

According to this embodiment, the assumptive quantity of radiation is taken by extrapolation at the stage of ending of the disregarding time for treatment end point detection, and the primary or the secondary differentiation is computed based on the quantity of radiation as taken by extrapolation and an actual quantity of radiation after the ending of the disregarding time for treatment end point detection phase, so that the primary differentiation is initiated as a variation with the time in the quantity of radiation at the stage of ending of the disregarding time for treatment end point detection, whereas the secondary differentiation is initiated in zero. Hence, the primary differential value or the secondary differential value becomes free from the effect of the starting radiation corresponding to a reaction product even when the reaction time of etching is short, and thus, the detection of the end point of the etching treatment can be made by having recourse only to a variation with the time in the quantity of radiation after the stage of ending of the disregarding time for treatment end point detection thereby preventing erroneous determination of the end point of the etching treatment and enabling to detect the same accurately.

As above described, according to the present invention, by using an apparatus comprising a means of selecting plasma spectrum having a characteristic wavelength from the plasma spectrum generated at the time of reaction in the plasma treatment of a specimen, a means of setting the disregarding time for treatment end point detection, a means of assuming at the stage when the disregarding time for treatment end point detection has elapsed a quantity of the selected plasma spectrum up to the time of said stage based on a quantity of same plasma spectrum at the time of said stage and a variation with the time in the last said quantity of plasma spectrum, and a means of detecting the end point of reaction in the plasma treatment of the specimen from the assumed quantity of plasma spectrum and an actual quantity of the same plasma spectrum after the time of said stage, an effect can be obtained such that the end point of reaction in the plasma treatment of the specimen is detected by selecting plasma spectrum having a characteristic wavelength from the plasma spectrum generating at the time of reaction in the plasma treatment of the specimen, by selecting the disregarding time for treatment end point detection, by assuming at the stage when the disregarding time for plasma treatment end point detection has elapsed a quantity of the selected plasma spectrum up to the time of said stage based on a quantity of the same plasma spectrum at the time of said stage and a variation with the time in the last said quantity of plasma spectrum, and by determining the end point of reaction in the plasma treatment of the specimen from the assumed quantity of plasma spectrum and an actual quantity of the same plasma spectrum after the time of said stage, thereby making it possible to prevent erroneous detection of the end point of reaction in the plasma treatment and detect accurately the same even when the reaction time of the plasma treatment is short.

What is claimed is:

1. A method for detecting an end point of a plasma treatment of a specimen comprising the steps of:
    selecting a characteristic wavelength from a plasma spectrum generated during the reaction time when the specimen is being treated with the plasma and measuring a quantity of the plasma spectrum having the selected characteristic wavelength;
    differentiating the measured quantity of the selected plasma spectrum having said characteristic wavelength as a function of plasma treatment reaction time to obtain a differential value;
    setting a disregarding time period defining a portion of the reaction time which is not considered in determining said end point, said disregarding time period beginning at the start of the plasma treatment reaction time;
    assuming a linear relationship between the quantity of the selected plasma spectrum having said characteristic wavelength and the plasma treatment reaction time up to the end of the disregarding time period based on the measured quantity of the selected plasma spectrum having said characteristic wavelength and its slope at the point in time when the disregarding time period elapses; at the point in time when the disregarding time period elapses initiating the differential value of the measured quantity of plasma spectrum having said characteristic wavelength as a function of time at the value obtained by differentiating the assumed linear relationship; and
    after the end of the disregarding time period detecting the end point of the plasma treatment reaction of the specimen when the differential value or the derivative of the differential value reaches a predetermined reference value.

2. A method of detecting an end point of plasma treatment as defined in claim 1, wherein the end point is detected when the differential value reaches a predetermined reference value.

3. A method of detecting an end point of plasma treatment as defined in claim 1, wherein the end point is detected when the derivative of the differential value reaches a predetermined reference value.

4. A method for detecting an end point of a plasma treatment of a specimen comprising the steps of:
    selecting a characteristic wavelength from a radiation generated as a reaction product during the reaction time when the specimen is being etched by plasma treatment and measuring a quantity of the radiation having the selected characteristic wavelength;
    differentiating the measured quantity of the selected radiation having said characteristic wavelength as a function of plasma treatment reaction time to obtain a differential value;
    setting a disregarding time period defining a portion of the reaction time which is not considered in determining said end point, said disregarding time period beginning at the start of the plasma treatment reaction time;
    assuming a linear relationship between the quantity of the selected radiation having said characteristic wavelength and the plasma treatment reaction time up to the end of the disregarding time period based on the measured quantity of the selected radiation having said characteristic wavelength and its slope at the point in time when the disregarding time period elapses;
    at the point in time when the disregarding time period elapses initiating the differential value of the measured quantity of radiation having the characteristic wavelength as a function of time at the value obtained by differentiating the assumed linear relationship; and
    after the end of the disregarding time period detecting the end point of the plasma treatment reaction of the specimen when the differential value or the derivative of the differential value reaches a predetermined reference value.

* * * * *